United States Patent
Lee et al.

(10) Patent No.: US 7,405,977 B2
(45) Date of Patent: Jul. 29, 2008

(54) FLASH MEMORY DEVICE WITH IMPROVED READ SPEED

(75) Inventors: Doo-Sub Lee, Suwon-si (KR); Heung-Soo Lim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/474,430

(22) Filed: Jun. 26, 2006

(65) Prior Publication Data

US 2007/0047300 A1 Mar. 1, 2007

(30) Foreign Application Priority Data

Aug. 25, 2005 (KR) .................. 10-2005-0078372

(51) Int. Cl.
*G11C 11/34* (2006.01)
*G11C 16/06* (2006.01)

(52) U.S. Cl. .................. 365/185.23; 365/185.03; 365/185.18; 365/189.09

(58) Field of Classification Search ............ 365/185.03, 365/185.18, 189.09, 185.23
See application file for complete search history.

(56) References Cited

U.S. PATENT DOCUMENTS

| | | | |
|---|---|---|---|
| 5,856,942 A | * | 1/1999 | Lee et al. ............ 365/185.11 |
| 6,026,014 A | * | 2/2000 | Sato et al. ............ 365/185.03 |
| 6,307,783 B1 | | 10/2001 | Parker |
| 6,473,344 B2 | | 10/2002 | Kim et al. |
| 6,768,676 B2 | | 7/2004 | Hirano |
| 6,870,785 B1 | | 3/2005 | Kang |

FOREIGN PATENT DOCUMENTS

| | | |
|---|---|---|
| JP | 2000-222894 | 8/2000 |
| JP | 2003-223791 | 8/2003 |
| JP | 2004319007 A | 11/2004 |
| KR | 1020030009281 A | 1/2003 |
| KR | 1020050025822 | 3/2005 |

\* cited by examiner

*Primary Examiner*—Huan Hoang
*Assistant Examiner*—Kretelia Graham
(74) *Attorney, Agent, or Firm*—Volentine & Whitt, PLLC

(57) ABSTRACT

A flash memory device comprises an array of memory cells arranged in rows and columns and a word line voltage generating circuit adapted to generate a plurality of read voltages at the same time during a multi-bit read operation. The device further comprises a row selecting circuit adapted to select one of the rows and drive the selected row with a word line voltage, and voltage lines transmitting the respective read voltages to the row selecting circuit as the word line voltage. The read voltages are supplied to the respective voltage lines before starting read periods of the multi-bit read operation.

18 Claims, 6 Drawing Sheets

FLASH MEMORY DEVICE WITH IMPROVED READ SPEED

BACKGROUND OF THE INVENTION

1. Field of the Invention

Embodiments of the present invention relate generally to a semiconductor memory device. More particularly, embodiments of the invention relate to a flash memory device having multi-bit memory cells.

This application claims the priority of Korean Patent Application No. 2005-78372, filed Aug. 25, 2005, the disclosure of which is hereby incorporated by reference in its entirety.

2. Description of Related Art

Flash memory is a popular form of non-volatile memory used in many modern electronic devices. Functionally, flash memory is a type of electrically erasable programmable read only memory (EEPROM) where memory cells can be programmed or read individually, but must be erased in units called "blocks." Flash memory can be found in a wide range of consumer and industrial electronic devices, from personal computers (PCs) and removable disk drives to cameras, cellular phones, and personal digital assistants.

Among the reasons for flash memory's popularity are its high degree of integration, high performance, durability, low power consumption, and its ability to store data even when power is cut off. Some of flash memory's drawbacks include its tendency to wear out over time (lack of endurance), the inability to erase one memory cell at a time, and its relatively low degree of integration and speed compared with various forms of volatile memory such as dynamic random access memory (DRAM) and static random access memory (SRAM).

The memory cells of a flash memory device are similar to traditional metal-oxide semiconductor (MOS) transistors, except that flash memory cells have two gate structures: a control gate and a floating gate. The floating gate is typically located between the control gate and a channel region and surrounded by an insulating layer such as an oxide layer. Data is stored in a flash memory cell by transferring electrical charges to the cell's floating gate during a programming operation. The data can then be read from the memory cell by applying a predetermined read voltage to the cell's control gate in a read operation and determining whether current can flow through the channel region. As more electrical charges are stored in the cell's floating gate, the amount of current that can flow through the channel decreases accordingly, because the stored electrical charges effectively raise the "threshold voltage" required to turn the cell on. Accordingly, a logic state of the memory cell can be determined by an amount of current that flows through the memory cell during the read operation.

The memory cells in most flash memory devices only store one bit of information. However, some flash memory devices use multi-bit memory cells which can store more than one bit. Similar to a one-bit flash memory cell, a multi-bit memory cell typically stores data by transferring discrete amounts of electrical charges to the cell's floating gate so that the cell's threshold voltage will fall into one of multiple predefined strata; the multi-bit memory cell reads the data by applying different read voltages to the memory cell's control gate and measuring whether current flows through the cell's channel region when the different read voltages are applied.

Figure 1:
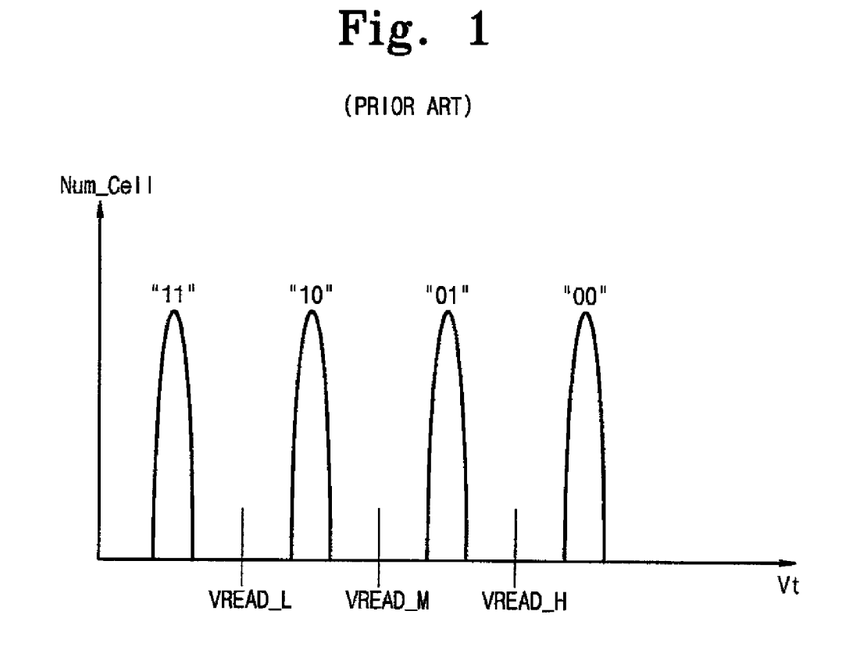
FIG. 1 is a graph illustrating a threshold voltage distribution of a 2-bit flash memory cell.
Figure 2:
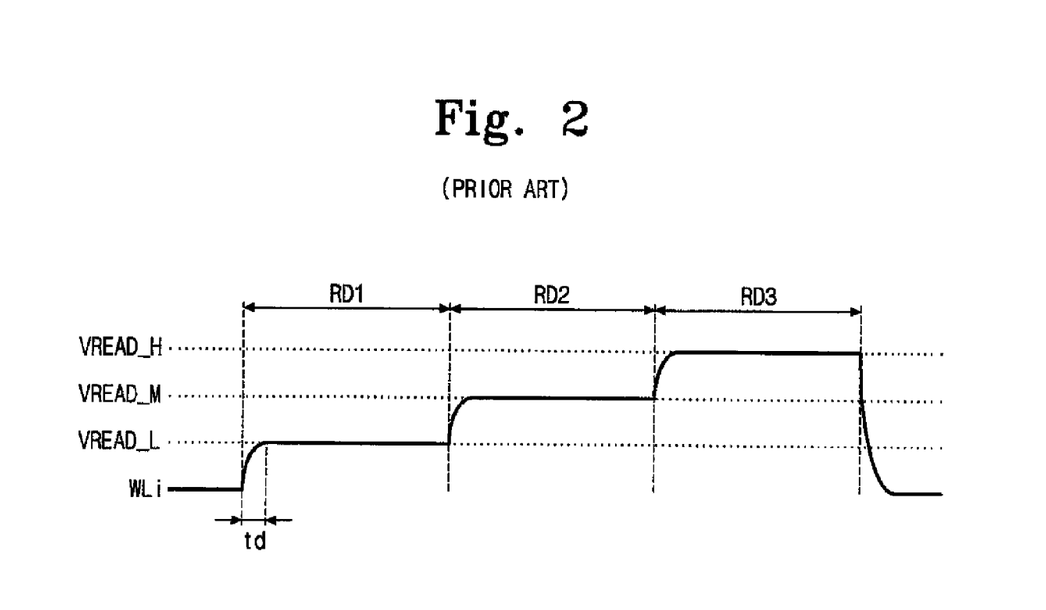
FIG. 2 is a graph illustrating a word line voltage of the 2-bit flash memory cell during a read operation.

For example, FIGS. 1 and 2 illustrate a method for performing a read operation to detect the logic state of a 2-bit flash memory cell. Referring to FIGS. 1 and 2, a first read voltage VREAD_L is applied to a selected word line during a first read period RD1; a second read voltage VREAD_M is applied to a selected word line in a second read period RD2; and a third read voltage VREAD_H is applied to a selected word line in a third read period RD3. In other words, the word line voltage gradually increases from first read voltage VREAD_L to third read voltage VREAD_H during the read operation.

If current flows through the memory cell when first read voltage VREAD_L is applied to the cell through the selected word line, then the memory cell stores "11." Else, if current flows through the memory cell when second read voltage VREAD_M is applied to the cell through the selected word line, then the memory cell stores "10." Else, if current flows through the memory cell when third read voltage VREAD_H is applied to the cell through the selected wordline, then memory cell stores "01." Otherwise, if current never flows through the memory cell during the first through third read periods, the memory cell stores "00."

Read voltages VREAD_L, VREAD_M and VREAD_H are typically generated using a conventional high-voltage generating circuit and supplied to selected word lines WLi through a transmission path during respective first through third read periods RD1 through RD3. The time required to set the read voltage on a particular selected word line WLi to a required voltage level, which is called a develop time (labeled "td" in FIG. 2), depends on the resistive-capacitive (RC) load of the transmission path. Where the transmission path is long, the develop time tends to increase accordingly.

Compared with a read operation for a 1-bit flash memory cell, a read operation for a multi-bit flash memory cell is slower due to the three read periods. Moreover, the develop time also tends to increase the time required for the read operation of the multi-bit cell. In other words, as the develop time becomes longer, the read time of the multi-bit cell increases accordingly. As a result, the read performance of the multi-bit cell is degraded.

SUMMARY OF THE INVENTION

Recognizing the need to improve the read performance in multi-bit (or "multi-level") flash cells, embodiments of the present invention provide multi-bit flash memory devices capable of improving the read performance by reducing the develop time.

According to one embodiment of the invention, a flash memory device comprises an array of multi-bit memory cells arranged in rows and columns, a word line voltage generating circuit adapted to generate a plurality of read voltages at the same time during a multi-bit read operation, a row selecting circuit adapted to select one of the rows and drive the selected row with a word line voltage, and voltage lines transmitting the respective read voltages to the row selecting circuit as the word line voltage. The read voltages are supplied to the respective voltage lines before starting read periods of the multi-bit read operation.

According to another embodiment of the invention, a flash memory device another adapted to store multi-bit data is provided. The device comprises a memory cell array including a plurality of banks, wherein each of the banks has a plurality of rows, and a plurality of decoding and driving blocks corresponding to the plurality of banks, respectively, wherein each of the decoding and driving blocks driving one of the rows of its corresponding bank with a word line voltage. The device further comprises a word line voltage generating circuit generating first, second, and third read voltages as the word line voltage during a multi-bit read operation, and a voltage transmission path simultaneously transmitting the first, second and third read voltages to the decoding and driving blocks. The first, second and third read voltages are supplied to the decoding and driving blocks through the voltage transmission path before starting read periods of the multi-bit read operation.

According to still another embodiment of the present invention, a row selecting circuit for a flash memory device having 2-bit memory cells arranged in rows and columns, is provided. The row selecting circuit comprises a decoder for decoding information to select one among the rows, first, second and third voltage lines receiving first, second and third read voltages during a multi-bit read operation, and a selector selecting one among the first, second, and third lines in response to control signals. The row selecting circuit further comprises a switch outputting a read voltage apparent on a voltage line selected by the selector in response to an output of the decoder, and a word line driver driving the selected row with the read voltage output by the switch in response to the output of the decoder.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

In this written description, the term "read operation" is used to describe a process for reading multiple bits of information from a nonvolatile memory cell. For example, a read operation may be used to read 2-bit data from a memory cell during first, second and third read periods.

Figure 3:
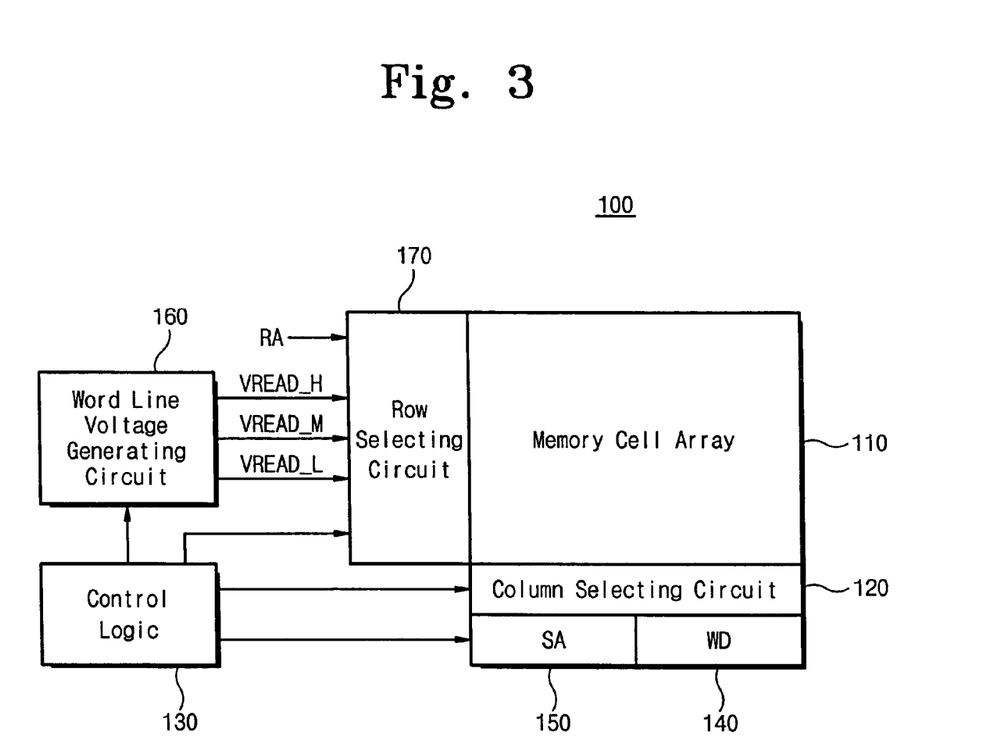
FIG. 3 is a block diagram illustrating a flash memory device according to an embodiment of the present invention.

FIG. 3 is a block diagram of a flash memory device 100 according to one embodiment of the present invention. The flash memory device shown in FIG. 3 is preferably a NOR flash memory device. However, those skilled in the art will recognize that the memory device of FIG. 3 could be alternatively configured to use other types of nonvolatile memory such as masked read only memory (MROM), programmable read only memory (PROM), ferroelectric random access memory (FRAM), or NAND flash memory.

Figure 4:
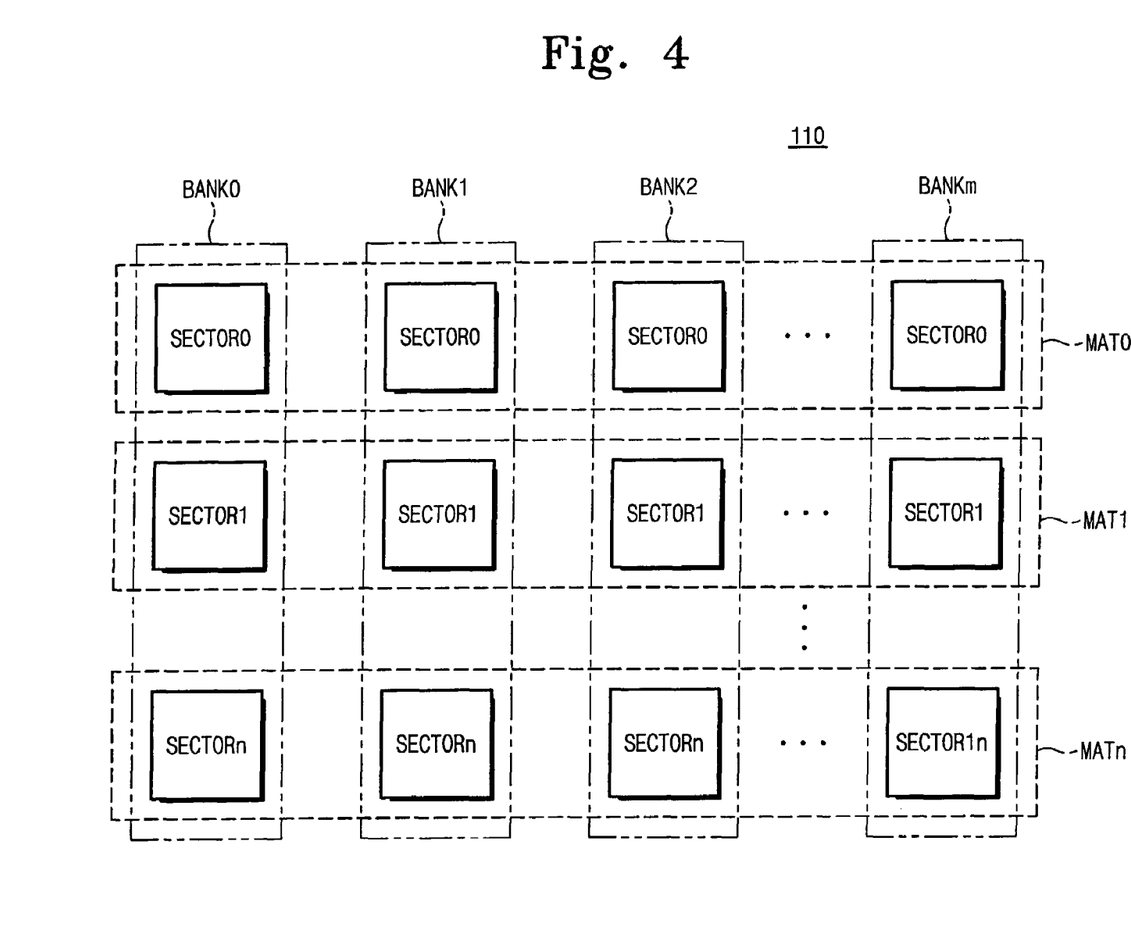
FIG. 4 is a block diagram illustrating a structure of a memory cell array shown in FIG. 3.

Referring to FIG. 3, flash memory device 100 comprises a memory cell array 110 including memory cells adapted to store N-bit data, where N is a number greater than or equal to two (2). As shown in FIG. 4, memory cell array 110 comprises a plurality of banks BANKi (i=0 to m), and each of banks BANKi includes a plurality of sectors SECTORj (j=0 to n). The sectors of each bank in the same row constitute a memory mat (MAT). Although not shown in FIG. 4, each sector includes a plurality of memory cells arranged in rows and columns, where all of the memory cells in one sector can be erased at the same time.

Flash memory device 100 further comprises a column selecting circuit 120, which is controlled by a control logic circuit 130. Column selecting circuit 120 is configured to select a predetermined unit of data such as a byte or a word, by selecting columns of the sectors in the selected bank(s) of memory cell array 110. A write driver circuit (WD) 140 drives the selected columns with a bit line voltage during a program operation. During a read operation, a sense amplifier (SA) 150 senses data from the memory cells through the selected columns.

Referring to FIG. 3, control logic circuit 130 also controls a word line voltage generating circuit 160 to generate word line voltage(s) used in different operation modes (e.g., a read mode, a write mode, a verify mode) of flash memory device 100.

During a program operation, word line voltage generating circuit 160 generates a program voltage to be supplied to a selected word line(s). During a read operation, word line voltage generating circuit 160 generates first, second and third read voltages VREAD_L, VREAD_M and VREAD_H to be supplied to the selected word line. Then, during a program verification operation, word line voltage generating circuit 160 generates verify voltages to be supplied to the selected word line(s).

First, second and third read voltages VREAD_L, VREAD_M and VREAD_H are supplied to the selected wordline(s) through a row selecting circuit 170. First through third read voltages VREAD_L, VREAD_M, and VREAD_H are supplied to row selecting circuit 170 before the start of a read operation to avoid delays associated with conventionally performed read operations such as the develop time illustrated in FIGS. 1 and 2. Row selecting circuit 170 then selects a wordline corresponding to a read address RA, and drives the selected wordline with first, second and third read voltages VREAD_L, VREAD_M and VREAD_H in corresponding first through third read periods RD1, RD2, and RD3 during the read operation.

Because first, second, and third read voltages VREAD_L, VREAD_M, and VREAD_H are supplied to row selecting circuit 170 before the word line is selected, the develop time required to set the read voltage on the selected word line is reduced.

Figure 5:
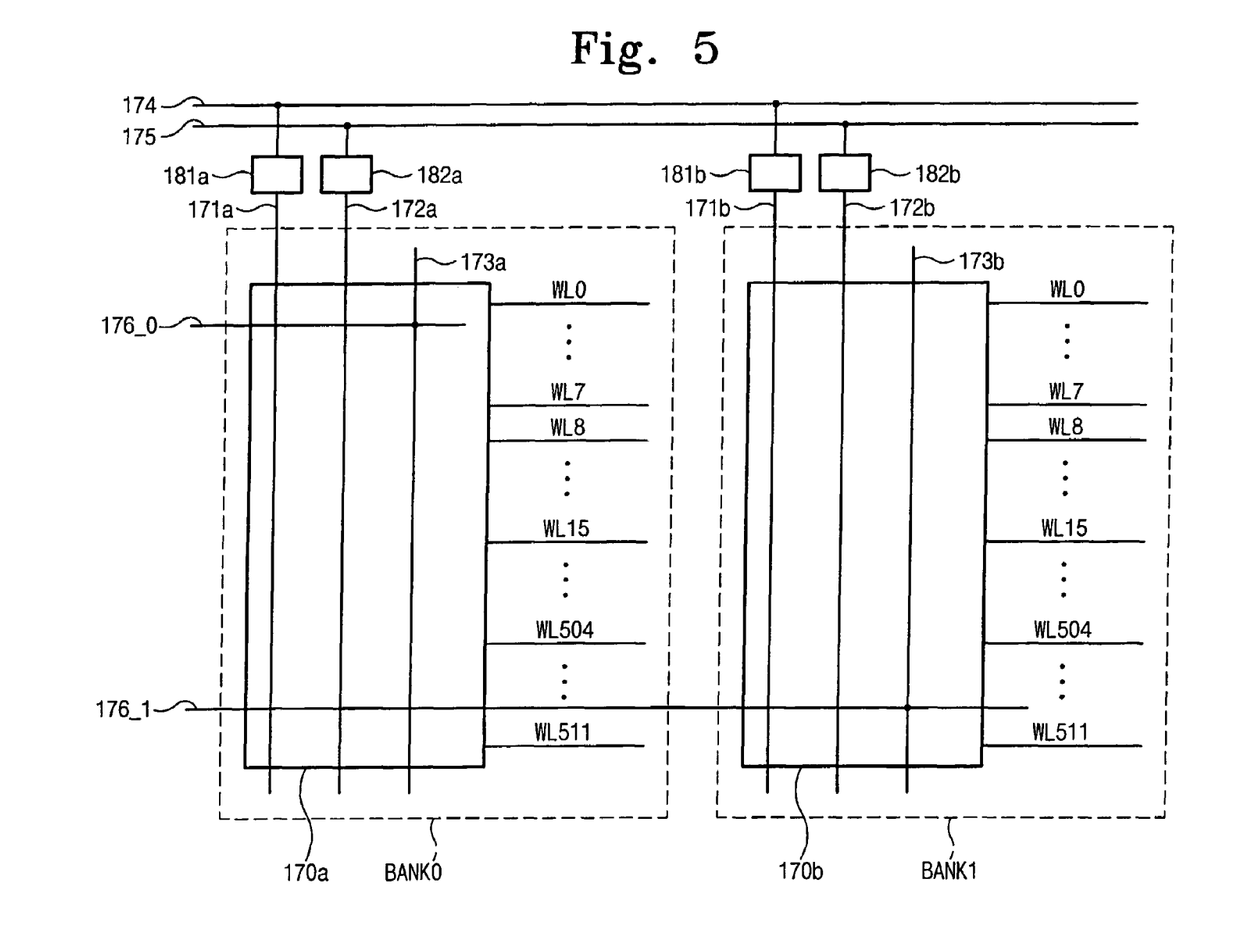
FIG. 5 is a block diagram illustrating a portion of selected banks shown in FIG. 3.

FIG. 5 is a block diagram illustrating a portion of banks BANK0 and BANK1 shown in FIG. 4. Only two banks BANK0 and BANK1 are illustrated in FIG. 5. However, the remaining banks in FIG. 4 are configured similar to banks BANK0 and BANK1 and so they have been omitted to avoid redundancy.

Referring to FIG. 5, each of banks BANK0 and BANK1 selects word lines WL0 through WL511. Banks BANK0 and BANK1 include respective decoding and driving blocks 170a and 170b for decoding a read address and driving the selected word line. Voltage lines (or voltage line segments) 171a through 173a are arranged substantially perpendicular to word lines WL0 through WL511 in decoding and driving block 170a. Voltage lines 171a through 173a are used for transmitting first read voltage VREAD_L, second read voltage VREAD_M, and third read voltage VREAD_H, respectively. Voltage lines 171a, and 172a are electrically connected to voltage lines 174 and 175, respectively, through corresponding switch circuits 181a and 182a. Voltage line 173a is electrically connected to a voltage line 176_0 arranged in substantially the same direction as word lines WL0 through WL511.

Similarly, voltage lines 171b, 172b and 173b are arranged substantially perpendicular to word lines WL0 through WL511 in decoding and driving block 170b. Voltage lines 171b, 172b and 173b are used for transmitting first read voltage VREAD_L, second read voltage VREAD_M, and third read voltage VREAD_H, respectively. Voltage lines 171b and 172b are electrically connected to voltage lines 174 and 175, respectively, through the corresponding switch circuits 181b and 182b, and voltage line 173b is electrically connected to a voltage line 176_1 arranged in substantially the same direction as word lines WL0 through WL511.

Since flash memory device 100 is a NOR flash memory device, conventional techniques can be applied to allow it to support a read while write (RWW) operation. In the RWW operation, a read operation is performed in one bank while a program operation is performed in another bank. To accomplish the RWW operation, switch circuits 181a and 182a are activated to electrically connect corresponding voltage lines (e.g. 174 and 171a, 175 and 172a) only during the read operation.

First through third read voltages VREAD_L, VREAD_M and VREAD_H are generated by word line voltage generating circuit 160 during the read operation and supplied to each of voltage lines 171a, 172a and 173a, and 171b, 172b and 173b through voltage lines 174, 175 and either 176_0 or 176_1, respectively, before a word line is selected according to read address RA. The first through third read voltages are supplied to the selected word line during first through third read periods RD1 through RD3, respectively.

For example, assume that the read operation is performed on a memory cell in bank BANK0. Before the start of first read period RD1, first through third read voltages VREAD_L, VREAD_M, and VREAD_H are supplied to respective voltage lines 171a through 173a. At the start of first read period RD1, a word line corresponding to read address RA is selected. Then, during first read period RD1, first read voltage VREAD_L is supplied to the selected word line through voltage line 171a. Next, during second read period RD2, second read voltage VREAD_M is supplied to the selected word line through voltage line 172a. Finally, during third read period RD3, third read voltage VREAD_H is supplied to the selected word line through voltage line 173a.

Because first through third read voltages VREAD_L, VREAD_M, and VREAD_H are supplied to voltage lines 171a through 173a before first through third read periods RD1 through RD3 during which the word line is selected, the develop time required for setting the read voltage on the selected word line to the desired voltage level depends on the RC load of the word line and not the RC load of the whole transmission path of the first through third read voltages. Accordingly, the develop time of the read operation is reduced.

Figure 6:
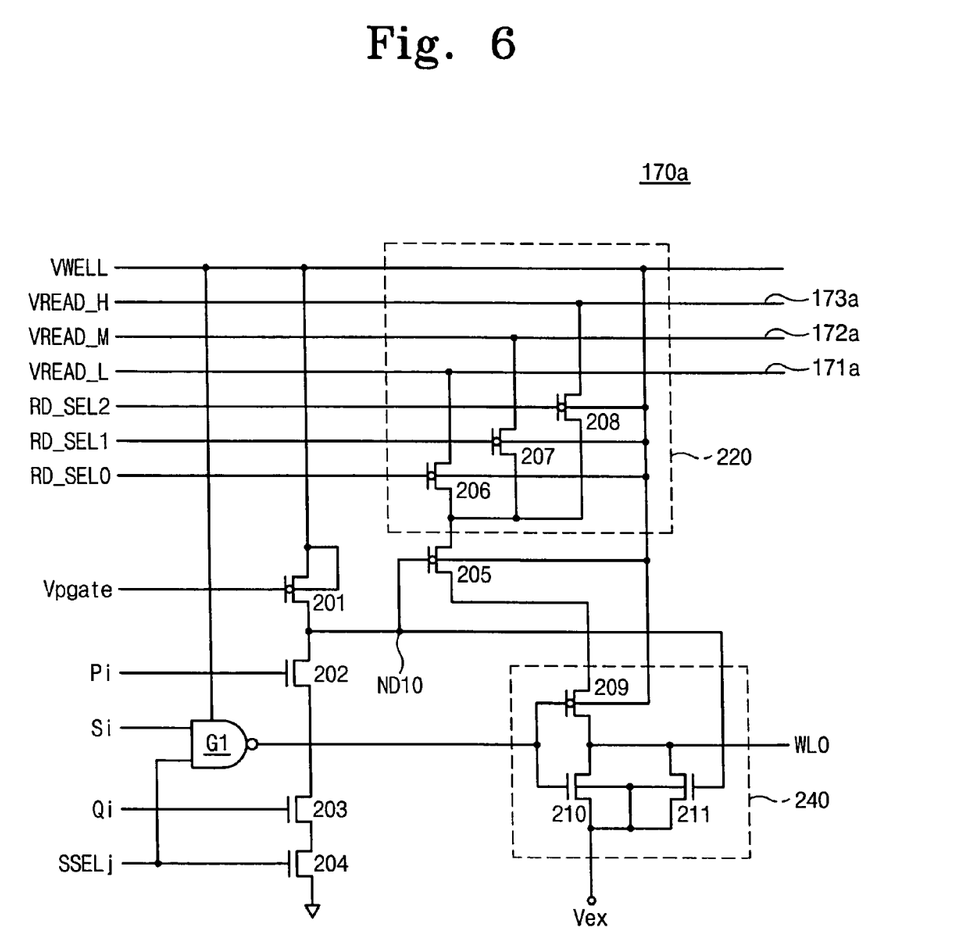
FIG. 6 is a circuit diagram illustrating a portion of a decoding and driving block shown in FIG. 5 and a corresponding word line; and, FIG. 7 is a timing diagram illustrating a read operation of a flash memory device according to one embodiment of the present invention.

FIG. 6 is a circuit diagram of a portion of decoding and driving block 170a shown in FIG. 5. The portion of decoding and driving block 170a shown in FIG. 6 is connected to word line WL0. Remaining portions connected to word lines WL1 through WL511 are similar, and therefore these portions have been omitted to avoid redundancy.

As illustrated in FIG. 4, each of banks BANK0 through BANKm includes a plurality of sectors SECTOR0 through SECTORn, and each of sectors SECTOR0 through SECTORn is selected by a corresponding sector select signal SSELj. Each of the sectors includes a plurality of segments, and each of the segments includes a plurality of word lines (e.g. eight word lines). Each of the word lines in each segment is selected by a corresponding word line select signal Si.

Referring to FIG. 6, decoding and driving block 170a comprises PMOS transistors 201 and 205, NMOS transistors 202, 203 and 204, a NAND gate G1, a selector 220, and a word line driver 240. PMOS transistor 201 is connected between a voltage VWELL and a node ND10, and controlled by a voltage Vpgate. NMOS transistors 202, 203 and 204 are serially connected between node ND10 and ground and are controlled by select signals Pi, Qi and SSELj, respectively, as address decoding signals. Select signals Pi and Qi are decoding signals for selecting a bank, and the select signal SSELj is a sector select signal. PMOS transistor 205 is connected between selector 220 and word line driver 240, and controlled by a voltage apparent at node ND10. NAND gate G1 is connected to receive select signals Si and SSELj. Select signal Si is a word line select signal that controls whether word line WL0 is selected or not.

During a read operation, voltage Vpgate is connected to ground and selector 220 selects one of the read voltages VREAD_L, VREAD_M and VREAD_H in response to control signals RD_SEL0, RD_SEL1 and RD_SEL2. The selected read voltage is then transmitted to the word line driver 240 through PMOS transistor 205. Control signals RD_SEL0, RD_SEL1 and RD_SEL2 define, i.e., control the duration of, the read period and are provided by control logic 130.

Selector 220 includes PMOS transistors 206, 207 and 208. PMOS transistor 206 includes a source connected to voltage line 171a, a drain connected the source of PMOS transistor 205, and a gate connected to receive a control signal RD_SEL0. PMOS transistor 207 includes a source connected to voltage line 172a, a drain connected the source of PMOS transistor 205, and a gate connected to receive a control signal RD_SEL1. PMOS transistor 208 includes a source connected to voltage line 173a, a drain connected the source of PMOS transistor 205, and a gate connected to receive a control signal RD_SEL2.

Word line driver 240 includes PMOS transistor 209 and NMOS transistors 210 and 211. PMOS transistor 209 includes a source connected to the drain of PMOS transistor 205, a drain connected to word line WL0, and a gate connected to receive an output of NAND gate G1. NMOS transistor 210 includes a drain connected to word line WL0, a gate connected to receive the output of NAND gate G1, and a source connected to a voltage Vex. NMOS transistor 211 includes a drain connected to word line WL0, a gate connected to node ND10, and a source connected to voltage Vex. Voltage Vex is a negative high voltage (e.g. −10V) during an erase operation and a ground voltage during read and program operations.

As illustrated in FIG. 6, a well bias voltage is supplied to a bulk of the PMOS transistors (including the PMOS transistors in the NAND gate) in decoding and driving block 170a. The transistors of decoding and driving block 170a include well-known high voltage transistors that can stand a high voltage such as a program and erase voltage.

In a preferred embodiment, PMOS and NMOS transistors 201, 202, 203 and 204 and NAND gate G1 include a decoder that decodes information to select the row. PMOS transistor 205 includes a switch outputting a voltage, which is supplied from selector 220 in response to an output of the decoder, to word line driver 240.

Figure 7:
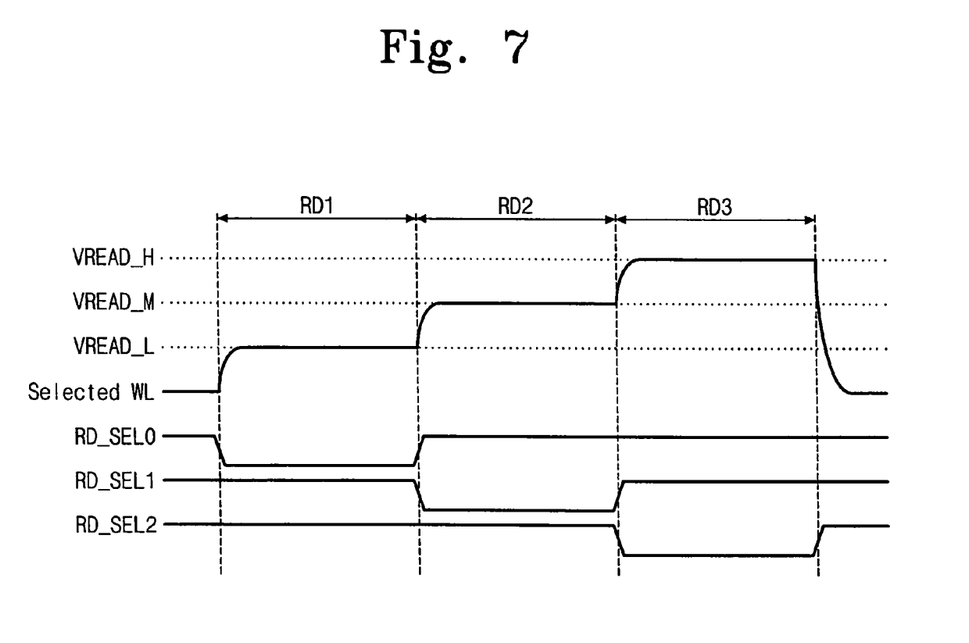

FIG. 7 is a timing diagram illustrating a read operation of a flash memory device according to an embodiment of the present invention. A read operation of the flash memory device will now be described below in more detail with reference to FIG. 7.

The read operation is for reading 2-bit data and includes three read periods RD1, RD2, and RD3. Before read periods RD1, RD2, and RD3, read voltages VREAD_L, VREAD_M and VREAD_H are generated by word line voltage generating circuit 160 under a control of control logic 130. As described above, switch circuits 181a, 182a, 181 b and 182b are activated during the read operation, and thus the voltage lines 174 and 175 are electrically connected to voltage lines 171a and 172a, and 171b and 172b arranged in decoding and driving blocks 170a and 170b, respectively.

In relation to BANK0, first, second and third read voltages VREAD_L, VREAD_M and VREAD_H are supplied to voltage lines 171a, 172a and 173a, respectively, through voltage lines 174, 175 and 176_0 arranged in the decoding and driving block 170a. Thereafter, NMOS transistors 202, 203 and 204 and PMOS transistor 209 are turned on by activation of select signals Pi, Qi, Si and SSELj. At this point, node ND10 is grounded through transistors 202, 203 and 204. At the same time, as illustrated in FIG. 7, control signal RD_SEL0 is deactivated, which turns on PMOS transistor 206 of selector 220.

As a result, read voltage VREAD_L supplied to voltage line 171a in advance is supplied to word line driver 240 through PMOS transistor 205. Read voltage VREAD_L is supplied to word line WL0 through turned-on PMOS transistor 209. Under this bias condition, sense amplifier circuit 150 senses data from the memory cells through columns selected by column selecting circuit 120.

Similar to the first read period RD1, when a second read period RD2 starts, control signal RD_SEL1 is activated to a low state as illustrated in FIG. 7. This turns on PMOS transistor 207 of selector 220. Accordingly, read voltage VREAD_M supplied to voltage line 172a in advance is supplied to word line driver 240 through PMOS transistor 205. The supplied read voltage VREAD_M is supplied to word line WL0 through turned-on PMOS transistor 209. Under this bias condition, sense amplifier circuit 150 senses data from the memory cells through columns selected by column selecting circuit 120.

Finally, when a third read period RD3 starts, control signal RD_SEL2 is activated to a low state as illustrated in FIG. 7. This turns on PMOS transistor 208 of selector 220. Accordingly, read voltage VREAD_H supplied to voltage line 173a in advance is supplied to word line driver 240 through PMOS transistor 205. The supplied read voltage VREAD_H is supplied to word line WL0 through turned-on PMOS transistor 209. Under this bias condition, sense amplifier circuit 150 senses data from the memory cells through columns selected by the column selecting circuit 120.

In flash memory devices according to selected embodiments of the invention, voltage lines 176_0, 176_1, and so on, for supplying read voltage VREAD_H to each of plurality of banks is used to supply the program voltage during the program operation. Accordingly, word line voltage generating circuit 160 may be configured to selectively drive voltage lines 176_j according to an operation mode of the memory device.

As described in the above, embodiments of the invention reduce the required develop time for setting read voltages on a selected word line to desired voltage levels during a read operation by providing the read voltages to row selecting circuit 170 before selecting the word line. Accordingly, the read speed and the performance of the flash memory device can be improved.

The foregoing preferred embodiments are teaching examples. Those of ordinary skill in the art will understand that various changes in form and details may be made to the exemplary embodiments without departing from the scope of the present invention as defined by the following claims.

What is claimed:

1. A flash memory device, comprising:
   an array of multi-bit memory cells arranged in rows and columns;
   a row selecting circuit comprising first, second, and third voltage lines, wherein the row selecting circuit selects a word line indicated by a read address and drives the selected word line with a word line voltage;
   a word line voltage generating circuit generating first, second, and third read voltages and respectively supplying the first, second, and third read voltages to the first, second and third voltage lines before the row selecting circuit selects the word line indicated by the read address;
   wherein the first, second, and third voltage lines respectively and sequentially apply the first, second, and third read voltages to the word line indicated by the read address as the word line voltage during a read operation.

2. The flash memory device of claim 1, wherein when the multi-bit data is 2-bit data, the read operation includes first, second and third read periods.

3. The flash memory device of claim 2, wherein the row selecting circuit sequentially applies the first, second, and third read voltages to the word line indicated by the read address during the first, second and third read periods, respectively.

4. The flash memory device of claim 1, wherein the first voltage line includes first and second line segments transmitting the first read voltage, wherein the first voltage line segment is arranged in a row direction, and the second voltage line segment is arranged in the row selecting circuit perpendicular to the row direction; and,
   the first and second voltage line segments are connected through a first switch circuit.

5. The flash memory device of claim 4, wherein the second voltage line includes third and fourth line segments transmitting the second read voltage, wherein the third voltage line segment is arranged in the row direction, and the fourth voltage line segment is arranged in the row selecting circuit perpendicular to the row direction; and,
   the third and fourth voltage line segments are connected through a second switch circuit.

6. The flash memory device of claim 5, wherein the first and second switch circuits are activated during at least a portion of the read operation and are deactivated during a program operation.

7. The flash memory device of claim 5, wherein the third voltage line includes fifth and sixth line segments transmitting the third read voltage, wherein the fifth voltage line segment is arranged in the row direction, and the sixth voltage line segment is arranged in the row selecting circuit perpendicular to the row direction.

8. The flash memory device of claim 1, wherein the row selecting circuit comprises:
   decoder circuitry decoding at least a portion of the read address;
   a word line driver driving the word line indicated by the read address with the word line voltage in response to an output of the decoder circuitry;
   a selector respectively applying the first, second and third read voltages to the word line driver in response to first, second and third control signals.

9. The flash memory device of claim 8, further comprising a switch connected between the selector and the word line driver and applying the first, second, and third read voltages in response to the output of the decoder circuitry.

10. A flash memory device adapted to store multi-bit data, the device comprising:
a memory cell array including a columnar arrangement of banks, each of the banks being addressed by a plurality of word lines;
at least one row selecting circuit selecting one of the plurality of word lines in response to a read address;
a plurality of decoding and driving blocks corresponding to the plurality of banks, respectively, each decoding and driving block comprising first, second, and third voltage line segments, and driving the selected word line with a word line voltage;
a word line voltage generating circuit generating first, second, and third read voltages;
first, second, and third voltage lines traversing the columnar arrangement of banks and simultaneously applying the first, second and third read voltages to the plurality of decoding and driving blocks before the row selecting circuit selects the word line in response to the read address.

11. The flash memory device of claim 10, wherein the first, second, and third voltage line segments in each one of the plurality of decoding and driving blocks respectively receives the first, second and third read voltages from the first, second, and third voltage lines.

12. The flash memory device of claim 10, wherein each of the plurality of decoding and driving blocks comprises:
decoder circuitry decoding the read address;
a word line driver driving the selected word line with the word line voltage in response to an output of the decoder circuitry;
a selector respectively applying the first, second, and third read voltages to the word line driver in response to first, second and third control signals.

13. The flash memory device of claim 12, further comprising a switch connected between the selector and the word line driver and applying the first, second, and third read voltages in response to the output of the decoder circuitry.

14. A row selecting circuit for a flash memory device, comprising; a memory cell array having multi-bit memory cells arranged in rows and columns, a word line voltage generating circuit generating first, second, and third read voltages, and control logic, wherein the row selecting circuit comprises;
decoder circuitry decoding a read address and selecting a word line in response to the read address;
first, second, and third voltage lines respectively receiving the first, second, and third read voltages from the word line voltage generating circuit before the decoder circuitry selects the word line during a multi-bit read operation;
a selector sequentially selecting between the first, second, and third voltage lines in response to control signals provided by the control logic;
a switch sequentially outputting the first, second, and third read voltages received from the first, second, and third voltage lines by operation of the selector in response to an output of the decoder circuitry; and,
a word line driver sequentially driving the selected word line with the first, second, and third read voltages output by the switch during first, second, and third read periods.

15. The row selecting circuit of claim 14, wherein the selector comprises:
a first PMOS transistor connected between the first voltage line and the switch and controlled by a first control signal indicative of the first read period;
a second PMOS transistor connected between the second voltage line and the switch and controlled by a second control signal indicative of the second read period; and,
a third PMOS transistor connected between the third voltage line and the switch and controlled by a third control signal indicative of the third read period.

16. The flash memory device of claim 10, wherein the first voltage line is respectively connected to first voltage line segments in each one of the plurality of decoding and driving blocks by a first switch, the second voltage line is respectively connected to second voltage line segments in each one of the plurality of decoding and driving blocks by a second switch, and each third voltage line segment in each one of the plurality of decoding and driving blocks is directly connected to a different third voltage line.

17. The flash memory of claim 16, wherein during a read operation directed to one of the banks, the first, second, and third read voltages are respectively and sequentially applied to the selected word line during first, second, and third read periods of the read operation via the first, second, and third voltage line segments.

18. The flash memory of claim 17, wherein the first switch in the one bank operates during the first read period, and the second switch in the one bank operates during the second read period.

* * * * *